United States Patent
Zhou et al.

(10) Patent No.: US 9,190,973 B2
(45) Date of Patent: Nov. 17, 2015

(54) HEADPHONE AMPLIFIER

(71) Applicant: Marvell World Trade Ltd., St. Michael (BB)

(72) Inventors: Hao Zhou, Shanghai (CN); Tao Shui, Cupertino, CA (US); Yonghua Song, Cupertino, CA (US); Yongxu Wang, Shanghai (CN); Haiqing Zhang, Shanghai (CN)

(73) Assignee: Marvell International Ltd., Hamilton (BM)

( * ) Notice: Subject to any disclaimer, the term of this patent is extended or adjusted under 35 U.S.C. 154(b) by 382 days.

(21) Appl. No.: 13/857,580

(22) Filed: Apr. 5, 2013

(65) Prior Publication Data

US 2013/0266157 A1    Oct. 10, 2013

Related U.S. Application Data

(60) Provisional application No. 61/620,928, filed on Apr. 5, 2012.

(51) Int. Cl.
*H03G 3/20* (2006.01)
*H03F 1/08* (2006.01)
*H03F 1/34* (2006.01)
*H03F 3/21* (2006.01)
*H03F 3/45* (2006.01)

(52) U.S. Cl.
CPC ............... *H03G 3/20* (2013.01); *H03F 1/083* (2013.01); *H03F 1/34* (2013.01); *H03F 3/21* (2013.01); *H03F 3/45475* (2013.01); *H03F 2200/153* (2013.01); *H03F 2203/45051* (2013.01); *H03F 2203/45138* (2013.01); *H03F 2203/45166* (2013.01); *H03F 2203/45522* (2013.01); *H03F 2203/45526* (2013.01)

(58) Field of Classification Search
CPC ............ H03G 3/20; H03F 1/083; H03F 1/34; H03F 3/21; H03F 3/45475; H03F 2203/45526; H03F 2203/45051; H03F 2203/45138; H03F 2203/45166; H03F 2203/45522; H03F 2200/153
USPC .............................. 381/120, 121; 330/86, 250
See application file for complete search history.

(56) References Cited

U.S. PATENT DOCUMENTS

| | | | |
|---|---|---|---|
| 4,559,502 A * | 12/1985 | Hiujsing | 330/297 |
| 6,084,478 A | 7/2000 | Mayampurath | |
| 7,239,202 B1 | 7/2007 | Aram | |
| 2009/0115528 A1 * | 5/2009 | Wang et al. | 330/293 |

(Continued)

OTHER PUBLICATIONS

Leung et al, "Analysis of multistage amplifier frequency compensation", IEEE vol. 48, No. 9; Sep. 2009.*

(Continued)

*Primary Examiner* — Vivian Chin
*Assistant Examiner* — David Ton

(57) ABSTRACT

Aspects of the disclosure process an amplifier circuit. The amplifier circuit includes an input stage, an intermediate stage, an output stage and a detecting and controlling circuit. The input stage is configured to receive an electrical signal for amplification. The intermediate stage is configured to amplify with an adjustable gain. The output stage is configured to drive an audio output device in response to the amplified electrical signal. The detecting and controlling circuit is configured to detect a current for driving the audio output device, and adjust the gain of the intermediate stage based on the current to compensate for a pole change of the amplifier circuit due to a change of the current.

20 Claims, 7 Drawing Sheets

(56) References Cited

U.S. PATENT DOCUMENTS

2010/0066449 A1* 3/2010 Dasgupta ...................... 330/253
2010/0283543 A1 11/2010 Shivaram et al.
2012/0038332 A1* 2/2012 Lin ............................... 323/277

OTHER PUBLICATIONS

International Search Report and Written Opinion of the International Searching Authority Issued Jun. 21, 2013 in PCT/US2013/035454.

* cited by examiner

HEADPHONE AMPLIFIER

INCORPORATION BY REFERENCE

This present disclosure claims the benefit of U.S. Provisional Application No. 61/620,928, "HEADPHONE AMPLIFIER" filed on Apr. 5, 2012, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Many electronic devices include audio amplifiers to drive audio output devices, such as speakers, headphones, earphones, and the like. For example, mobile entertainment electronics, such as mobile phones, portable music players, handheld game consoles, and the like include headphone amplifiers to drive headphones, earphones, and the like. Generally, the mobile entertainment electronics are powered by batteries. Thus, the headphone amplifiers are preferred to have a low power consumption in addition to other operational and performance requirements.

SUMMARY

Aspects of the disclosure process an amplifier circuit. The amplifier circuit includes an input stage, an intermediate stage, an output stage and a detecting and controlling circuit. The input stage is configured to receive an electrical signal for amplification. The intermediate stage is configured to amplify with an adjustable gain. The output stage is configured to drive an audio output device in response to the amplified electrical signal. The detecting and controlling circuit is configured to detect a current for driving the audio output device, and adjust the gain of the intermediate stage based on the current to compensate for a pole change of the amplifier circuit due to a change of the current.

In an embodiment, the detecting and controlling circuit is configured to detect a volume to drive the audio output device, and adjust the gain of the intermediate stage based on the volume. Further, in an example, the detecting and controlling circuit is configured to reduce the gain of the intermediate stage when the output current of the output stage is larger than a threshold. For example, the detecting and controlling circuit is configured to adjust the gain of the intermediate stage such that a second pole frequency is higher than a gain bandwidth product (GBW) and is smaller than a third pole frequency.

According to an aspect of the disclosure, the intermediate stage is configured to adjust the gain based on a signal frequency of the electrical signal.

Aspects of the disclosure provide a method. The method includes receiving an electrical signal at an input stage of an amplifier for driving an audio output device, amplifying the electrical signal in an intermediate stage of the amplifier with a gain adjusted based on an output current to drive the audio output device in order to compensate for a pole change of the amplifier due to a change of the output current, and driving the audio output device in response to the amplified electrical signal.

Aspects of the disclosure provide an integrated circuit (IC) chip. The IC chip includes a decoding circuit configured to convert a digital signal into an analog signal and an audio amplifier configured to amplify the analog signal to drive an audio output device. The audio amplifier includes an input stage configured to receive the analog signal for amplification, an intermediate stage configured to amplify with an adjustable gain, an output stage configured to drive the audio output device in response to the amplified analog signal, and a detecting and controlling circuit configured to detect an output current for driving the audio output device, and adjust the gain of the intermediate stage based on the output current to compensate for a pole change of the audio amplifier due to a change of the output current.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
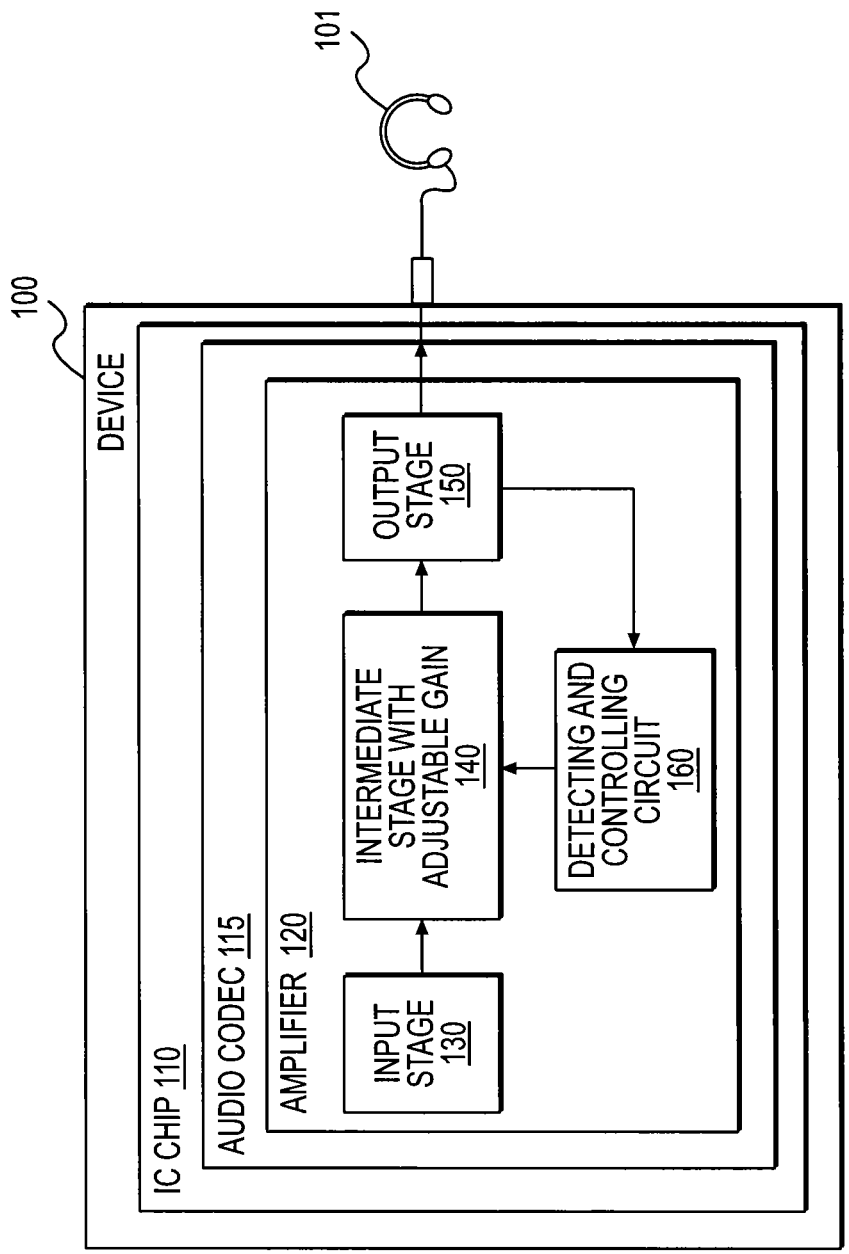
FIG. 1 shows a block diagram of an electronic device example 100 according to an embodiment of the disclosure.

FIG. 1 shows a block diagram of an electronic device example 100 according to an embodiment of the disclosure. The electronic device 100 includes an amplifier 120. The amplifier 120 includes an intermediate stage 140 with an adjustable gain. In an embodiment, the gain is adjusted based on an output current of the amplifier 120 to improve amplifier stability without sacrifice of chip area and/or power consumption.

The electronic device 100 can be any suitable device, such as handheld device, mobile phone, laptop computer, desktop computer, net book computer, electronic book, personal digital assistant (PDA), tablet, MP3 player, and the like. In an embodiment, the electronic device 100 is battery powered device. Thus, electronic components in the electronic device 100 are preferred to have a relatively low power consumption.

According to an aspect of the disclosure, the amplifier 120 is an audio amplifier configured to drive an audio output device, such as a headphone, an earpiece, a desktop speaker, and the like. It is noted that the audio output device can be a part of the electronic device 100 or can be an external component plugged into an interface of the electronic device 100.

In the FIG. 1 example, the amplifier 120 is implemented as integrated circuits on an integrated circuit (IC) chip 110. The IC chip 110 includes an audio codec circuit module 115. The audio codec circuit module 115 includes a processing circuit (not shown) configured to encode an analog audio signal as digital signals and/or decode digital signals back into an analog audio signal. The amplifier 120 is coupled to the processing circuit to receive the analog audio signal, amplify the analog audio signal, and drive a load device, such as a headphone 101 shown in FIG. 1, to produce audio waves according to the analog audio signal. It is noted that, in another example, the amplifier 120 can be implemented on an IC chip separate from other circuits of the audio codec circuit module 115. Further, in another example, the amplifier 120 can be implemented using discrete components.

Specifically, in the FIG. 1 example, the amplifier 120 includes a plurality of stages, such as an input stage 130, the intermediate stage 140, an output stage 150, and the like. The plurality of stages are coupled together to receive an electrical signal, such as a relatively small analog audio signal, amplify the analog audio signal, and accordingly drive an output current to the headphone 101. According to an embodiment of the disclosure, the last stage of the amplifier 120 that drives the output current, such as the output stage 150, is a power amplifier that operates with large signals. In an example, the output current is indicative of the sound output from the headphone 101. When the output current is small, the volume is low, and when the output current is large, the volume is high.

Generally, the output stage 150 consumes a large portion of the total power consumption of the amplifier 120. The other stages of the amplifier 120, such as the input stage 130 and the intermediate stage 140, operate with relatively small signals, and have a relatively small power consumption. In an example, the output stage 150 is a class AB type power amplifier. It is noted that the output stage 150 can be other suitable type of power amplifier, such as class A type power amplifier, class B type power amplifier, and the like.

According to an embodiment of the disclosure, audio output devices may have different parasitic capacitance and resistance. For example, a headphone 101 may have a capacitance in a range from 1 pF to 10 nF, and a resistance about 16 ohms. The amplifier 120 is configured to drive the headphone 101 that has a large range of capacitive load with a relatively low current, such as about 200 uA quiescent current, and a relatively large unit-gain bandwidth, such as 3 MHz unity-gain bandwidth.

Generally, the amplifier 120 includes one or more compensation capacitors to improve amplifier stability. According to an embodiment of the disclosure, the compensation capacitors are on-chip capacitors that consume chip area. The amplifier 120 is configured to use relatively low compensation capacitances to enable amplifier stability, such that the chip area can be relatively small.

According to an aspect of the disclosure, the amplifier 120 includes a detecting and controlling circuit 160. The detecting and controlling circuit 160 is configured to detect an output current level from the amplifier 120 to the headphone 101. Based on the detected output current, the detecting and controlling circuit 160 generates a control signal to control the gain of the intermediate stage 140, such that parameters of the amplifier 120 satisfy stabilization conditions no matter the output current is low or high.

According to another aspect of the disclosure, a volume control input signal (not shown) is provided to the amplifier 120 to control the output current of the amplifier 120 to the headphone 101. In an embodiment, the detecting and controller circuit 160 generates the control signal based on the volume control input signal to control the gain of the intermediate stage 140, such that the parameters of the amplifier 120 satisfy stabilization conditions no matter the volume of the output sound is high or low.

Figure 2:
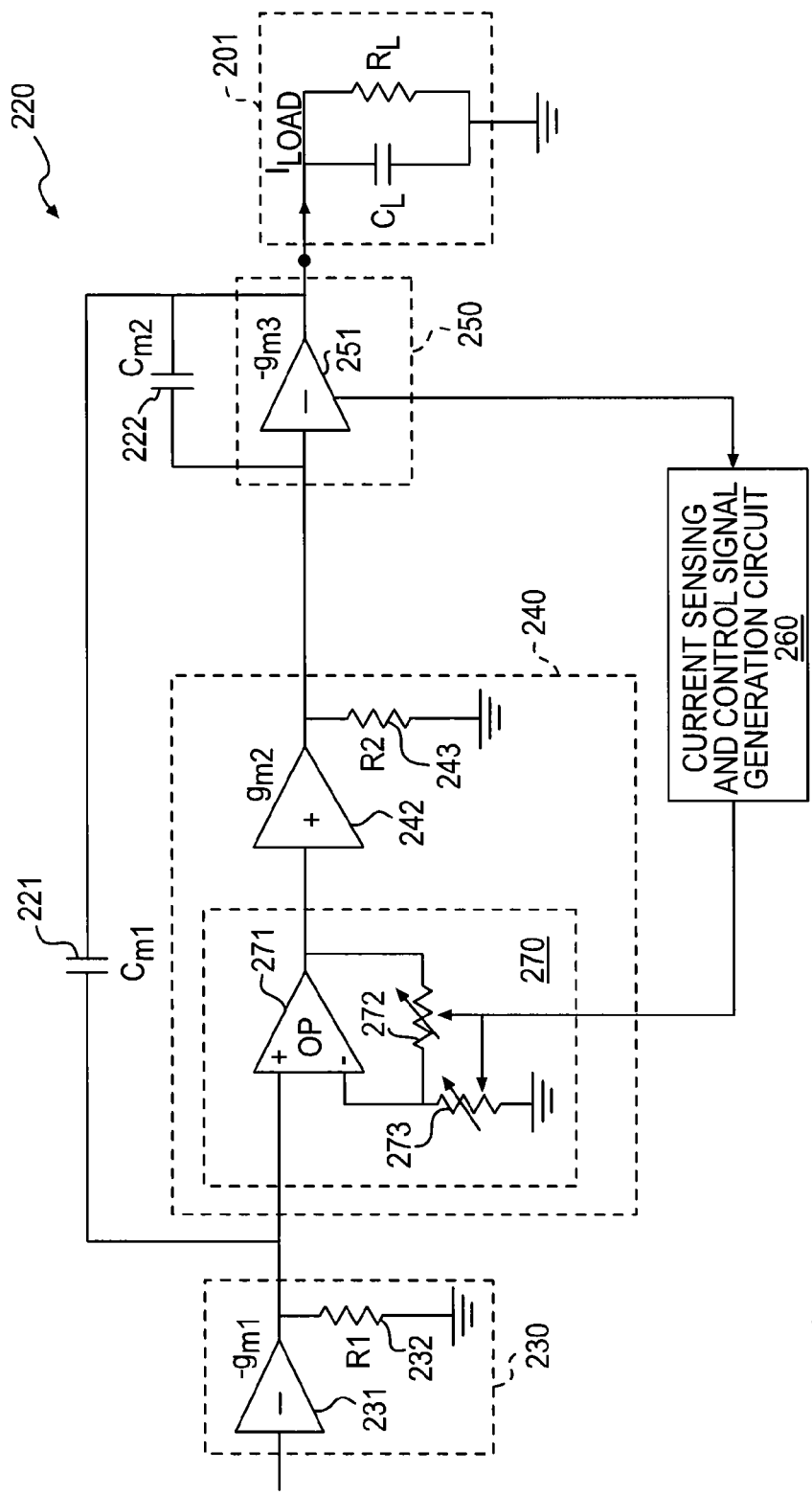
FIG. 2 shows a block diagram of an amplifier 220 according to an embodiment of the disclosure.

FIG. 2 shows a block diagram of an amplifier 220 driving a load device 201 according to an embodiment of the disclosure. In an example, the load device 201 is a headphone, such as the headphone 101, and the amplifier 220 can be used in the audio codec circuit module 115 as the amplifier 120. The amplifier 220 includes a first stage 230, a second stage 240, a third stage 250, a first compensation capacitor 221, a second compensation capacitor 222 and a current sensing and control signal generation circuit 260. These elements are coupled together as shown in FIG. 2.

Specifically, the first stage 230, the second stage 240 and the third stage 250 are coupled together in series to amplify an input electrical signal. The first stage 230 includes a first amplifying circuit 231 and a first resistor 232. The first amplifying circuit 231 has a first trans-conductance $-g_{m1}$, and the first resistor 232 has a first resistance R1. The second stage 240 includes a variable gain circuit 270, a second amplifying circuit 242 and a second resistor 243. The variable gain circuit 270 has a variable gain $A_{variable}$. The second amplifying circuit 242 has a second trans-conductance $-g_{m2}$, and the second resistor 243 has a second resistance R2. The third stage 250 includes a third amplifying circuit 251 with a third trans-conductance $-g_{m3}$. The first compensation capacitor 221 is coupled between the output of the first stage 230 and the output of the third stage 250, and the second compensation capacitor 222 is coupled between the output of the second stage 240 and the output of the third stage 250. The first compensation capacitor 221 has a first capacitance $C_{m1}$ and the second compensation capacitor 222 has a second capacitance $C_{m2}$.

The load device 201 is modeled as a capacitive load $C_L$ and a resistive load $R_L$ coupled together.

In the FIG. 2 example, the variable gain circuit 270 includes an operation amplifier 271, a first adjustable resistor 272 and a second adjustable resistor 273 coupled together as shown in FIG. 2. The gain of the variable gain circuit 270 can be adjusted by suitably adjusting the resistances of the first adjustable resistor 272 and the second adjustable resistor 273.

In the FIG. 2 example, the current sensing and control signal generation circuit 260 is coupled to the third stage 250 to detect an output current $I_{LOAD}$ to the load device 201. Based on the output current $I_{LOAD}$, the current sensing and control signal generation circuit 260 generates one or more control signals. The control signals can be analog signals or digital signals. The control signals are used to adjust the resistances of the first and second adjustable resistors 272 and 273.

According to an aspect of the disclosure, the voltage gain ($A_v(s)$) of the amplifier 220 is expressed in Eq. 1

$$A_v(s) = \frac{A_{do}\left(1 + \frac{S}{Z_1} + \frac{S^2}{Z_1 Z_2}\right)}{\left(1 + \frac{S}{p_1}\right)\left(1 + \frac{S}{p_2} + \frac{S^2}{p_2 p_3}\right)} \qquad \text{Eq. 1}$$

where $A_{dc}$ denotes DC voltage gain, $p_1$ denotes the dominant pole, $p_2$ denotes the second pole, $p_3$ denotes the third pole, $z_1$ denotes the first zero point, and $z_2$ denotes the second zero point. The DC voltage gain $A_{dc}$, and the dominant pole $p_1$ can be expressed in Eq. 2 and Eq. 3:

$$A_{da} = g_{m1} R_1 A_{varible} g_{m2} R_2 g_{m2} R_L \qquad \text{Eq. 2}$$

$$p_1 = \frac{1}{R_1 C_{m1} A_{varible} g_{m2} R_2 g_{m2} R_L} \qquad \text{Eq. 3}$$

Thus, the gain-bandwidth product (GBW) can be expressed as in Eq. 4:

$$GBW = A_{do} \times p_1 = \frac{g_{m1}}{C_{m1}} \qquad \text{Eq. 4}$$

It is noted that the gain-bandwidth product has the same value as unit-gain bandwidth.

According to an embodiment of the disclosure, when the inequations # $p_3 > p_2 >$ GBW are satisfied, the amplifier 220 is stable. However, the second pole $p_2$ and the third pole $p_3$ move with the output current $I_{LOAD}$. According to an embodiment of the disclosure, the variable gain $A_{variable}$ is adjusted to compensate for the change of the second pole $p_2$ due to the output current change, to enable the inequations $p_3 > p_2 >$ GBW being satisfied for both large and small output current $I_{LOAD}$.

Specifically, in an embodiment, the second pole $p_2$ can be expressed in Eq. 5:

$$p_2 = \frac{A_{varible} g_{m2}}{C_{m2}} \times \frac{g_{m2} R_L}{1 + g_{m2} R_L} \quad \text{Eq. 5}$$

When the output current $I_{LOAD}$ is large, $g_{m3} R_L \gg 1$, the second pole $p_2$ and the third pole $p_3$ can be expressed in Eq. 6 and Eq. 7:

$$p_2 = \frac{A_{varible} g_{m2}}{C_{m2}} \quad \text{Eq. 6}$$

$$p_3 = \frac{g_{m3}}{C_L} \quad \text{Eq. 7}$$

When the output current $I_{LOAD}$ is small, $g_{m3} R_L \ll 1$, the second pole $p_2$ and the third pole $p_3$ can be expressed in Eq. 8 and Eq. 9:

$$p_2 = \frac{A_{varible} g_{m2} g_{m3} R_L}{C_{m2}} \quad \text{Eq. 8}$$

$$p_3 = \frac{1}{R_L C_L} \quad \text{Eq. 9}$$

It is noted that the second pole $p_2$ shrinks when the output current $I_{LOAD}$ is small. According to an embodiment of the disclosure, the variable gain $A_{variable}$ is adjusted to be relatively large when the output current $I_{LOAD}$ is small to compensate for the second pole shrinkage due to the small output current $I_{LOAD}$, such that the second pole $p_2$ is still larger than the GBW. Thus, in an example, the amplifier 220 is able to be designed with relatively small absolute values for the third trans-conductance $g_{m3}$ and the first trans-conductance $g_{m1}$, and thus the amplifier 220 has a relatively small power consumption. Further, the amplifier 220 is able to be designed with a relatively small value for the first capacitance $C_{m1}$ to save chip area.

Figure 3A:
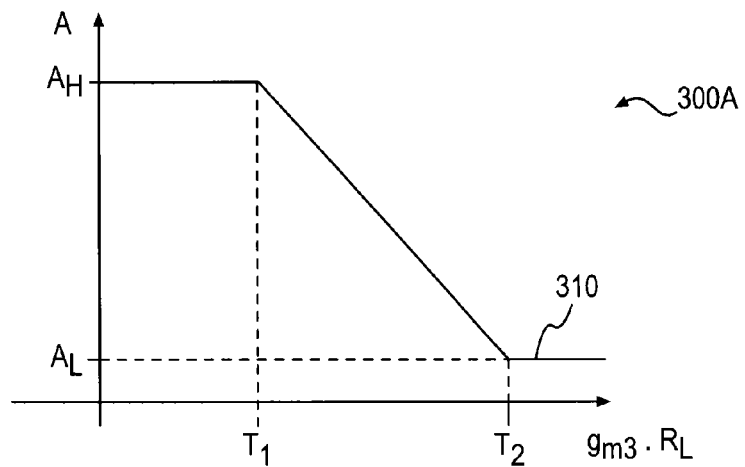
FIGS. 3A and 3B show plots of parameter characteristics for an amplifier according to an embodiment of the disclosure.

FIG. 3A shows a plot 300A of the variable gain adjustment according to an embodiment of the disclosure. The X-axis is $g_{m3} R_L$ that is indicative of output current, and the Y-axis is the value for the variable gain $A_{variable}$. The plot 300A includes a curve 310. The curve 310 shows that the value of the variable gain $A_{variable}$ is adjusted based on the output current. When the output current is small, for example, when the value of $g_{m3} R_L$ is smaller than a relatively small value, such as T1 (T1<1), the variable gain $A_{variable}$ has a relatively large value, such as $A_H$. When the output current is large, for example, when the value of $g_{m3} R_L$ is larger than a relatively large value, such as T2 (T2≥1), the variable gain $A_{variable}$ has a relatively small value, such as $A_L$. When the output current is larger than T1 and smaller than T2, the variable gain $A_{variable}$ is adjusted between $A_H$ and $A_L$ to compensate for pole movement due to output current change.

Figure 3B:
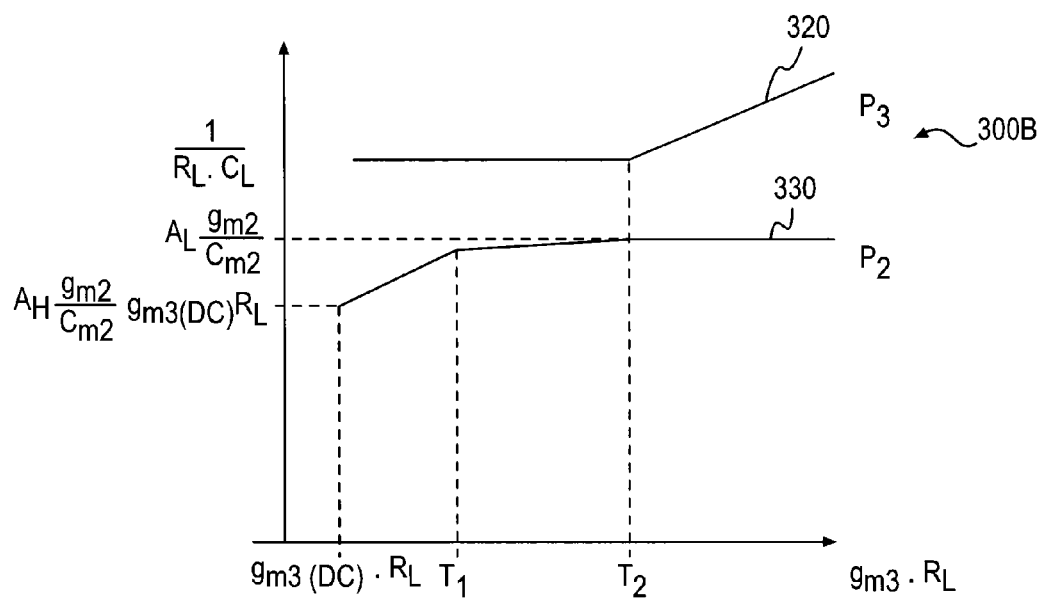

FIG. 3B shows a plot 300B of the second pole $p_2$ and the third pole $p_3$ changing with output current according to an embodiment of the disclosure. The X-axis is $g_{m3} R_L$ that is indicative of output current, and the Y-axis is frequency for the second pole $p_2$ and the third pole $p_3$. The plot 300B includes a first curve 320 that shows the value change of the third pole $p_3$ with the output current, and a second curve 330 that shows the value change of the second pole $p_2$ with the output current. The value change of the second pole $p_2$ is compensated by the adjustment of the variable gain $A_{variable}$. For example, when the value of $g_{m3} R_L$ is smaller than T1, the second curve 330 has a much steep slope. When the value of $g_{m3} R_L$ is larger than T1 and smaller than T2, the second curve 330 has much smaller slop due to the compensation of the variable gain $A_{variable}$ adjustment.

Figure 4:
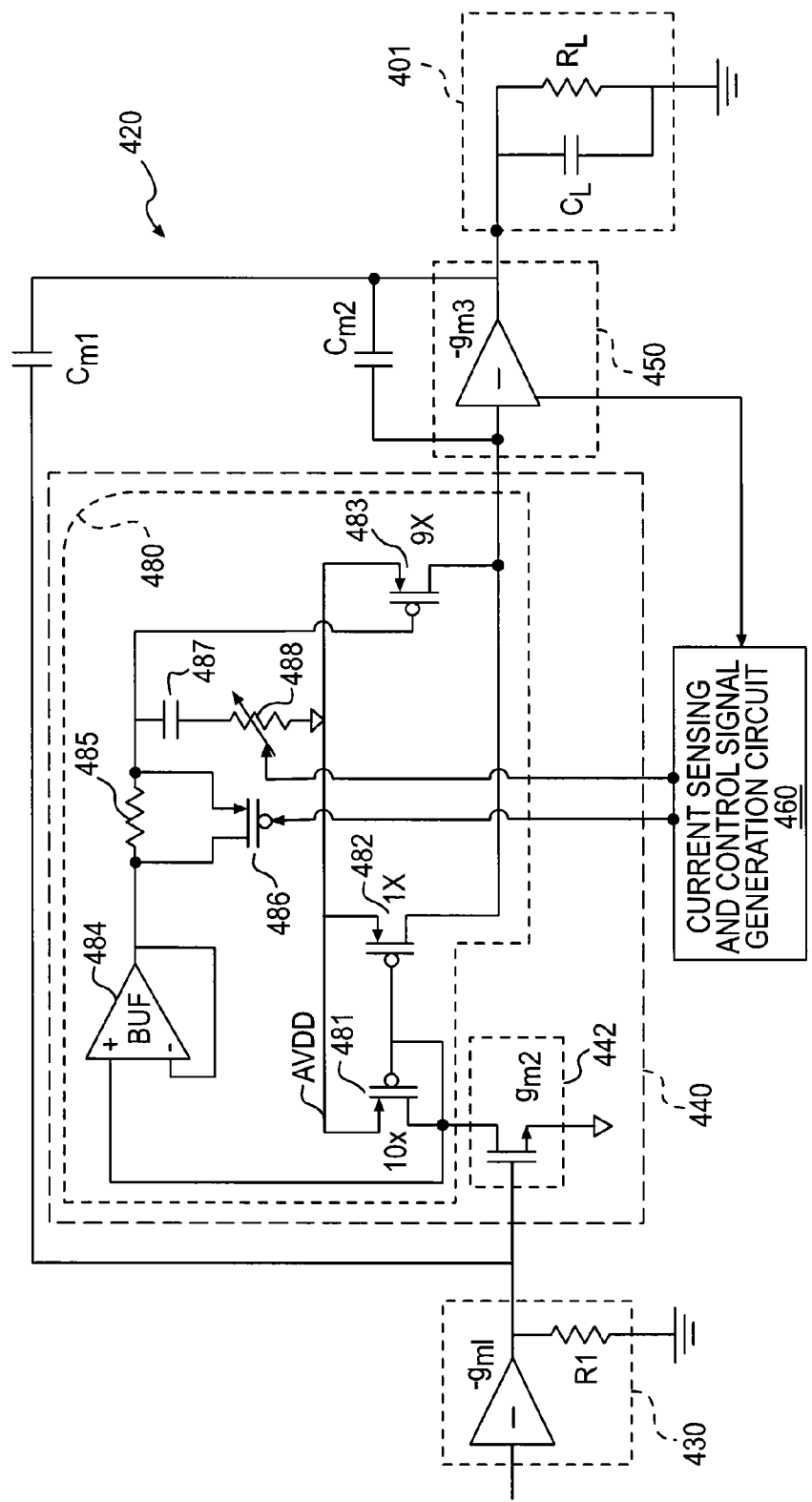
FIG. 4 shows a diagram of an amplifier 420 according to an embodiment of the disclosure.

FIG. 4 shows a diagram of an amplifier 420 driving a load device 401 according to an embodiment of the disclosure. The amplifier 420 utilizes certain components that are identical or equivalent to those used in the amplifier 220, such as the first stage 430, the third stage 450, the current sensing and control signal generation circuit 460, and the like; the description of these components has been provided above and will be omitted here for clarity purposes.

In the FIG. 4 example, the second stage 440 includes a variable gain circuit 480 and a second amplifying circuit 442. The variable gain circuit 480 has a variable gain $A_{variable}$. The second amplifying circuit 442 has a second trans-conductance $g_{m2}$. In the FIG. 4 example, the second amplifying circuit 442 uses a single N-type metal-oxide-semiconductor field-effect transistor (MOSFET). It is noted that the second amplifying circuit 442 can be modified to use other amplifying architecture.

The variable gain circuit 480 is configured to implement an adaptive frequency compensation technique to adjust $A_{variable}$ based on frequency and output current. In the FIG. 4 example, the variable gain circuit 480 generates a first current portion and a second current portion based on an output of the second amplifying circuit 442. The first and second current portions are combined to drive the third stage 450.

Specifically, the variable gain circuit 480 includes P-type MOSFET transistors 481-483 and 486, a voltage buffer 484, a resistor 485, an adjustable resistor 488, and a capacitor 487. These elements are coupled together as shown in FIG. 4.

The P-type MOSFET transistors 481 and 482 are coupled together in a current mirror architecture such that the gate voltage of the transistor 482 is the same as the gate voltage of the transistor 481 which is the output voltage of the second amplifying circuit 442. The current flowing through the transistor 482 is proportional to the current flowing through the transistor 481 based on the sizes of the transistors. The current flowing through the transistor 481 is the same as the current flowing through the N-type MOSFET in the second amplifying circuit 442. In the example, the width to length ratio of the transistor 481 is ten times of the width to length ratio of the transistor 482.

The size of the transistor 483 is related to the size of the transistor 482. For example, the width to length ratio of the transistor 483 is nine times of the width to length ratio of the transistor 482. However, the gate voltage of the transistor 483 is adjusted based on the output current from the third stage 450, and the frequency of the input signal.

In an example, the current sensing and control signal generation circuit 460 generates the control signals based on the output current from the third stage 450, and provide the control signals to control the transistor 486 and the adjustable resistor 488 to change the gate voltage of the transistor 483. Further, due to the impedance difference of the capacitor 487 to different frequencies, the gate voltage of the transistor 483 also varies with the signal frequency. Thus, the current following through the transistor 483 varies with the output current of the third stage 450 and the input signal frequency, and the gain of the variable gain circuit 480 varies with the output current of the third stage 450 and the input signal frequency. In the FIG. 4 example, the gain of the variable gain circuit 480 is expressed in Eq. 10:

$$A_{variable} = \frac{1 + \left(\frac{1}{10}RV_1 + RV_2\right)CS}{1 + (RV_1 + RV_2)CS} \qquad \text{Eq. 10}$$

Where $RV_1$ denotes the resistance of the circuit formed by the parallel coupled resistor 485 and the transistor 486, and the $RV_2$ denotes the resistance of the adjustable resistor 488, C denotes the capacitance of the capacitor 487.

In an example, when output current is small, the current sensing and control signal generation circuit 460 turns on the transistor 486, and thus $RV_1$ is about zero. The gain $A_{variable}$ is about 1. When the output current is large, current sensing and control signal generation circuit 460 turns off the transistor 486, and thus $RV_1$ is the resistance of the resistor 485 which can be made much larger than $RV_2$. Then, the gain of the variable gain circuit 480 can be expressed in Eq. 11:

$$A_{variable} \approx \frac{1 + \frac{1}{10}RV_1 CS}{1 + RV_1 CS} \qquad \text{Eq. 11}$$

As can be seen from Eq. 11, when the output current is large, the gain of the variable gain circuit 480 varies with frequency.

Figure 5:
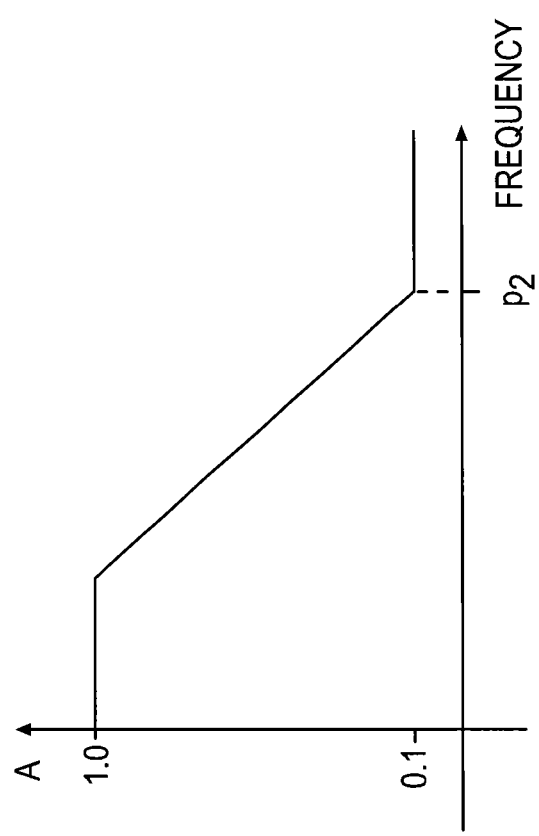
FIG. 5 shows a plot of a gain characteristic for an amplifying stage according to an embodiment of the disclosure.

FIG. 5 shows a plot of a gain characteristic to frequency according to Eq. 11 according to an embodiment of the disclosure. In the FIG. 5 example, when the frequency is low, the gain is about 1, and when the frequency is high, the gain is about ⅒. In an embodiment, the resistance of the resistor 485 and the capacitance of the capacitor 487 are suitably determined, such that when the frequency band is near the second pole $p_2$, the gain is about ⅒.

Figure 6:
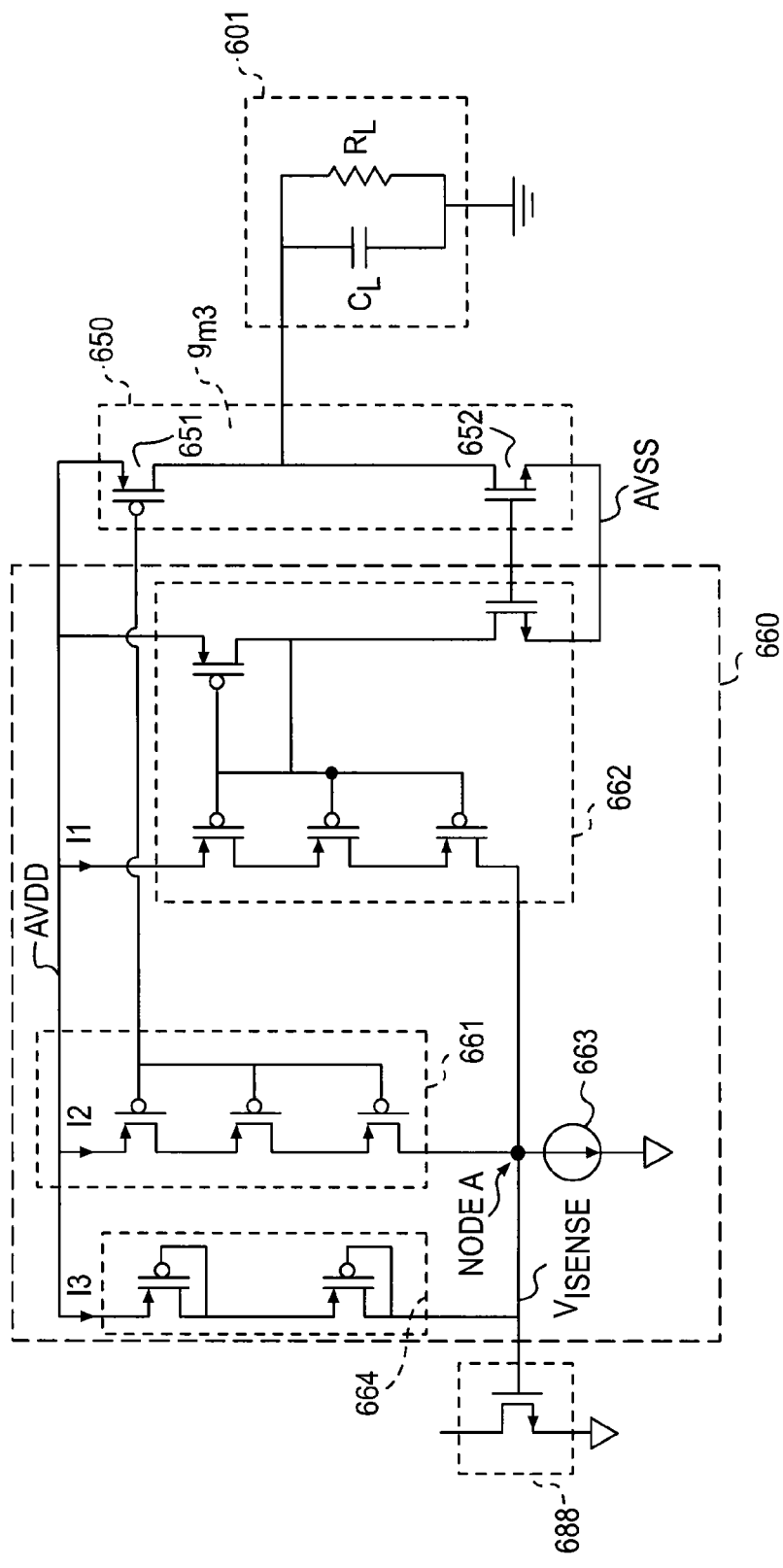
FIG. 6 shows a diagram of current sensing and control signal generation circuit 660 according to an embodiment of the disclosure.

FIG. 6 shows a diagram of current sensing and control signal generation circuit 660 according to an embodiment of the disclosure. The current sensing and control signal generation circuit 660 can be used in an amplifier circuit, such as the amplifier 120, the amplifier 220, the amplifier 420, and the like to sense an output current, and generate a control signal based on the output current to control a gain of an intermediate stage.

In the FIG. 6 example, the current sensing and control signal generation circuit 660 is coupled to an output stage 650 to sense the output current of the output stage 650. Further, the current sensing and control signal generation circuit 660 is coupled to circuits in an intermediate stage, such as an adjustable resistor circuit 688, to control a resistance of the resistor circuit 688 in order to adjust the gain of the intermediate stage. In the FIG. 6 example, the adjustable resistor circuit 688 includes an N-type MOSFET transistor, the resistance of the resistor circuit 688 is a turn-on resistance of the N-type MOSFET transistor. It is noted that the resistor circuit 688 can be used in the amplifier 420 as the adjustable resistor 488 in an example.

In the FIG. 6 example, the output stage 650 is configured as a class AB type power amplifier. The output stage 650 includes a P-type MOSFET transistor 651 and an N-type MOSFET transistor 652 coupled together as shown in FIG. 6. In an example, during class AB operation, the transistors 651 and 652 alternatively drive a load 601. Each of the transistors 651 and 652 operates over a half of a cycle, but also conducts a small amount on the other half.

The current sensing and control signal generation circuit 600 includes a first sensing portion 662 configured to sense a current flowing through the transistor 652, and a second sensing portion 661 configured to sense a current following through the transistor 651. In the example, a current I1 flowing through the first sensing portion 662 is proportional to the current flowing through the transistor 652. Similarly, a current I2 following through the second sensing portion 661 is proportional to the current flowing through the transistor 651.

Further, the current sensing and control signal generation circuit 600 generates a voltage $V_{ISENSE}$ at a node A based on the sensed current I1 and I2. In an example, when the output current of the output stage 650 increases, either the current I1 or the current I2 increases. Due to the constant current source 663, then a current I3 flowing through a circuit 664 decreases. Due to the decrease of the current I3, the voltage $V_{ISENSE}$ at the node A increases. The increase of the voltage $V_{ISENSE}$ can reduce a resistance of the adjustable resistor circuit 688 (the turn-on resistance of the N-type MOSFET transistor decreases).

When the output current of the output stage 650 decreases, either the current I1 or the current I2 decreases. Due to the constant current source 663, then the current I3 flowing through the circuit 664 increases. Due to the increase of the current I3, the voltage $V_{ISENSE}$ at the node A decreases. The decrease of the voltage $V_{ISENSE}$ can increase the resistance of the adjustable resistor circuit 688 (the turn-on resistance of the N-type MOSFET transistor increases).

Figure 7:
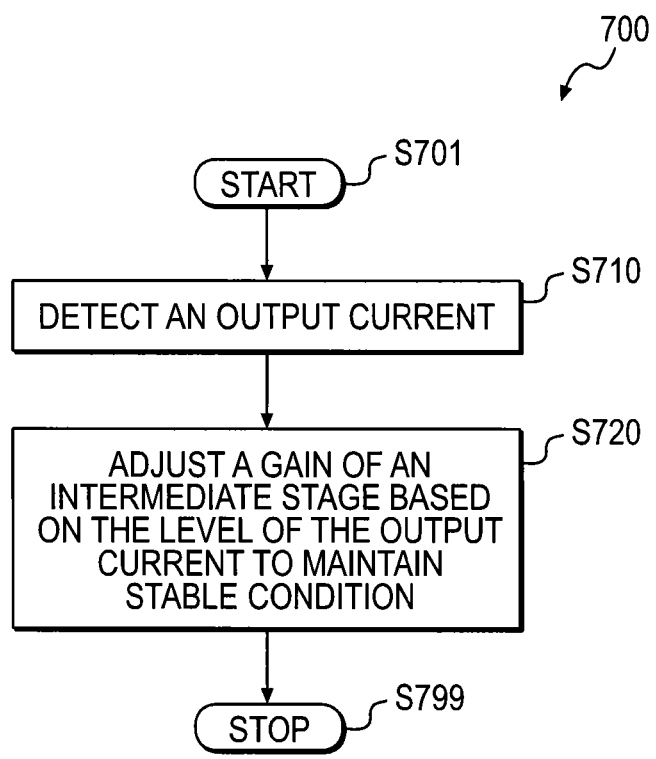
FIG. 7 shows a flowchart outlining a process example according to an embodiment of the disclosure.

FIG. 7 shows a flowchart outlining a process example 700 according to an embodiment of the disclosure. In an embodiment, the process 700 is executed by the detecting and controlling circuit 160 in the amplifier 120. The process starts at S701 and process to S710.

At S710, the detecting and controlling circuit 160 detects an output current level from the amplifier 120 to the headphone 101. It is noted that, in another embodiment, the detecting and controller circuit 160 detects a volume level for driving the headphone 101.

At S720, the detecting and controlling circuit 160 generates a control signal to control the gain of the intermediate stage 140 based on the output current level. In an embodiment, the gain of the intermediate stage 140 is controlled in the manner to compensate for pole frequency change due to the output current change. Thus, parameters of the amplifier 120 satisfy stabilization conditions no matter the output current is low or high. The process then proceeds to S799 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:
1. An amplifier circuit, comprising:
an input stage configured to receive an electrical signal for amplification;
an intermediate stage configured to amplify the electrical signal with an adjustable gain;

an output stage configured to drive an audio output device in response to the amplified electrical signal; and a detecting and controlling circuit configured to detect an output current for driving the audio output device, and adjust the gain of the intermediate stage based on the current to compensate for a pole change of the amplifier circuit due to a change of the current.

2. The amplifier circuit of claim 1, wherein the detecting and controlling circuit is configured to detect a volume to drive the audio output device, and adjust the gain of the intermediate stage based on the volume.

3. The amplifier circuit of claim 1, wherein the detecting and controlling circuit is configured to reduce the gain of the intermediate stage when the output current of the output stage is larger than a threshold.

4. The amplifier circuit of claim 1, wherein the detecting and controlling circuit is configured to adjust the gain of the intermediate stage such that a second pole frequency is higher than a gain bandwidth product (GBW) and is smaller than a third pole frequency.

5. The amplifier circuit of claim 1, wherein the intermediate stage is configured to adjust the gain based on a signal frequency of the electrical signal.

6. The amplifier circuit of claim 1, wherein the intermediate stage is configured to adjust the gain between an upper limit and a lower limit.

7. The amplifier circuit of claim 1, wherein the output stage is of a class-AB type.

8. A method, comprising:
receiving an electrical signal at an input stage of an amplifier for driving an audio output device;
amplifying the electrical signal in an intermediate stage of the amplifier with a gain adjusted based on an output current to drive the audio output device in order to compensate for a pole change of the amplifier due to a change of the output current; and
driving the audio output device in response to the amplified electrical signal.

9. The method of claim 8, wherein amplifying the electrical signal in the intermediate stage of the amplifier with the gain adjusted based on the output current to drive the audio output device in order to compensate for the pole change of the amplifier due to the change of the output current comprises:
detecting a volume for driving the audio output device; and
adjusting the gain of the intermediate stage based on the volume.

10. The method of claim 8, wherein amplifying the electrical signal in the intermediate stage of the amplifier with the gain adjusted based on the output current to drive the audio output device in order to compensate for the pole change of the amplifier due to the change of the output current comprises:
reducing the gain of the intermediate stage when the output current is larger than a threshold.

11. The method of claim 8, wherein amplifying the electrical signal in the intermediate stage of the amplifier with the gain adjusted based on the output current to drive the audio output device in order to compensate for the pole change of the amplifier due to the change of the output current comprises:
adjusting the gain of the intermediate stage such that a second pole frequency is higher than a gain bandwidth product (GBW) and is smaller than a third pole frequency.

12. The method of claim 8, further comprising:
adjusting the gain based on a signal frequency of the electrical signal.

13. The method of claim 8, further comprising:
adjusting the gain between an upper limit and a lower limit.

14. The method of claim 8, wherein driving the audio output device in response to the amplified electrical signal further comprises:
driving the audio output device by a class-AB type output stage.

15. An integrated circuit (IC) chip, comprising:
a decoding circuit configured to convert a digital signal into an analog signal; and
an audio amplifier configured to amplify the analog signal to drive an audio output device, the audio amplifier including:
an input stage configured to receive the analog signal for amplification;
an intermediate stage configured to amplify the analog signal with an adjustable gain;
an output stage configured to drive the audio output device in response to the amplified analog signal; and
a detecting and controlling circuit configured to detect an output current for driving the audio output device, and adjust the gain of the intermediate stage based on the output current to compensate for a pole change of the audio amplifier due to a change of the output current.

16. The IC chip of claim 15, wherein the detecting and controlling circuit is configured to detect a volume for driving the audio output device, and adjust the gain of the intermediate stage based on the volume.

17. The IC chip of claim 15, wherein the detecting and controlling circuit is configured to reduce the gain of the intermediate stage when the output current of the output stage is larger than a threshold.

18. The IC chip of claim 15, wherein the detecting and controlling circuit is configured to adjust the gain of the intermediate stage such that a second pole frequency is higher than a gain bandwidth product (GBW) and is smaller than a third pole frequency.

19. The IC chip of claim 15, wherein the intermediate stage is configured to adjust the gain based on a signal frequency of the analog signal.

20. The IC chip of claim 15, wherein the intermediate stage is configured to adjust the gain between an upper limit and a lower limit.

* * * * *